(12) United States Patent
Gong et al.

(10) Patent No.: US 6,902,994 B2
(45) Date of Patent: Jun. 7, 2005

(54) METHOD FOR FABRICATING TRANSISTOR HAVING FULLY SILICIDED GATE

(75) Inventors: Yoyi Gong, Hsinchu (TW); Tony Lin, Hsinchu (TW); Jung-Tsung Tseng, Sijhih (TW); Abula Yu, Sinjhuang (TW)

(73) Assignee: United Microelectronics Corp., Hsinchu (TW)

( * ) Notice: Subject to any disclaimer, the term of this patent is extended or adjusted under 35 U.S.C. 154(b) by 131 days.

(21) Appl. No.: 10/643,675

(22) Filed: Aug. 15, 2003

(65) Prior Publication Data

US 2005/0037558 A1 Feb. 17, 2005

(51) Int. Cl.[7] .................... H01L 21/3205; H01L 21/28
(52) U.S. Cl. ........................................ 438/592; 438/682
(58) Field of Search ................................ 438/197, 300, 438/592, 682

(56) References Cited

U.S. PATENT DOCUMENTS 6,853,020 B1 * 2/2005 Yu et al. ..................... 257/270

* cited by examiner

Primary Examiner—Craig A. Thompson
(74) Attorney, Agent, or Firm—J.C. Patents

(57) ABSTRACT

A method for fabricating a transistor having a fully silicided gate is described. A silicon substrate with a semi-finished transistor formed thereon is provided, wherein the transistor comprises a gate dielectric film, a silicon gate, a cap layer on the silicon gate, a spacer and a source/drain region. A raised source/drain is formed on the source/drain region, and then the cap layer is removed. Subsequently, a full silicidation process is performed to fully silicide the silicon gate.

20 Claims, 2 Drawing Sheets

METHOD FOR FABRICATING TRANSISTOR HAVING FULLY SILICIDED GATE

BACKGROUND OF THE INVENTION

1. Field of the Invention

The present invention relates to a semiconductor process. More particularly, the present invention relates to a method for fabricating a transistor having a fully silicided gate.

2. Description of the Related Art

As semiconductor devices are continuously being miniaturized, the RC delay effect becomes an important issue. To reduce the RC delay effect of a MOS transistor, the gate is usually formed with a metal silicide layer thereon, or is directly formed from a metal that has a lower resistance. The metal gates in a CMOS device are usually formed with a dual-metal process, wherein the gates of NMOS and those of PMOS are formed from two metals with different work functions to achieve symmetric threshold voltages for NMOS and PMOS. In order to simplify the metal gate process, a metal having a work function around silicon's mid-gap value of 4.6–4.7 eV might be used alone to achieve symmetric threshold voltages for NMOS and PMOS. However, such a work function would cause relatively high threshold voltages that do not meet the requirement of high performance in current semiconductor devices.

Recently, CMOS transistors having fully silicided gates for both NMOS and PMOS were reported, wherein the metal silicide material can have two different work functions that contribute to symmetric threshold voltages for NMOS and PMOS. The metal silicide gates are formed with a single full silicidation process of polysilicon gates. The full silicidation process is similar to an ordinary salicide (self-aligned silicide) process, but is continued for a longer period to fully silicide the polysilicon gates. Such a silicide gate is superior to a polysilicon gate for having a lower resistance and no gate depletion effect.

However, since the duration of a full silicidation process is longer and the silicon atoms in the source/drain (S/D) region also react with the metal, the shallow S/D junction of the transistor is easily damaged to cause a junction leakage in the vertical direction. Further, the S/D junction and the channel are easily shorted to cause a leakage in the lateral direction. Such a problem cannot be solved by increasing the depth of the S/D junction, since the depth of the S/D junction must be sufficiently small to prevent the short channel effect (SCE).

SUMMARY OF THE INVENTION

In view of the foregoing, this invention provides a method for fabricating a transistor having a fully silicided gate. The method forms a raised S/D on the S/D region to protect the shallow S/D junction from being damaged.

The method for fabricating a transistor having a fully silicided gate of this invention is described as follows. A substrate with a semi-finished transistor formed thereon is provided, wherein the semi-finished transistor comprises a gate dielectric film, a silicon gate on the gate dielectric film, a cap layer on the silicon gate, a spacer on the sidewalls of the silicon gate and a source/drain region in the substrate beside the silicon gate. A raised source/drain is formed on the source/drain region, and then the cap layer is removed. Subsequently, a full silicidation process is performed to fully silicide the silicon gate. In the method, the cap layer can be an anti-reflection coating (ARC) that is useful in the patterning process of the silicon gate.

Since the source/drain region is protected by the raised source/drain formed thereon in the full silicidation process in this invention, fewer silicon atoms in the source/drain region are consumed. Therefore, it is possible to fully silicide the silicon gate without damaging the shallow S/D junction to cause a vertical leakage or shorting the S/D junction and the channel to cause a lateral leakage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The preferred embodiment of this invention is described below referring to FIGS. 1–6. The embodiment and the drawings are intended to explain the principles of the invention, but not to restrict the scope of this invention.

Figure 1:
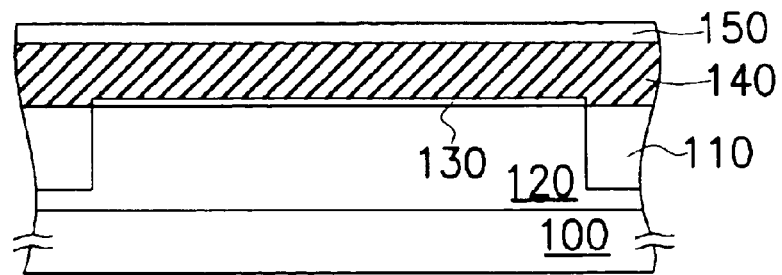
FIGS. 1–6 illustrate a process flow of fabricating a transistor having a fully silicided gate according to a preferred embodiment of this invention.

Referring to FIG. 1, a silicon substrate 100, such as a P⁻-doped single-crystal silicon substrate, is provided, and an isolation structure 110 is formed in the substrate 100 to define an active area. The isolation structure 110 is, for example, a shallow trench isolation (STI) structure that can be formed with any well-known techniques in the art. A well 120 is then formed in the silicon substrate 100 by, for example, performing a deep ion implantation process and a high-temperature annealing process in sequence. The dopant in the well 120 is a P-type dopant like boron as the transistor to be formed is an NMOS, or is an N-type dopant like phosphorous or arsenic as the transistor to be formed is a PMOS. Thereafter, a gate dielectric film 130, a polysilicon layer 140 and an anti-reflection coating (ARC) 150 are sequentially formed on the substrate 100. The gate dielectric film 130 is a silicon oxide film formed with thermal oxidation, or a silicon oxide/silicon nitride (ON) composite film formed with thermal oxidation and subsequent thermal nitridation. The polysilicon layer 140 is formed with a chemical method, such as low-pressure chemical vapor deposition (LPCVD). The anti-reflection coating 150 is made from an organic material, such as silicon nitride (SiN) or silicon oxynitride (SiON), so as to withstand high temperatures in subsequent processes.

Figure 2:
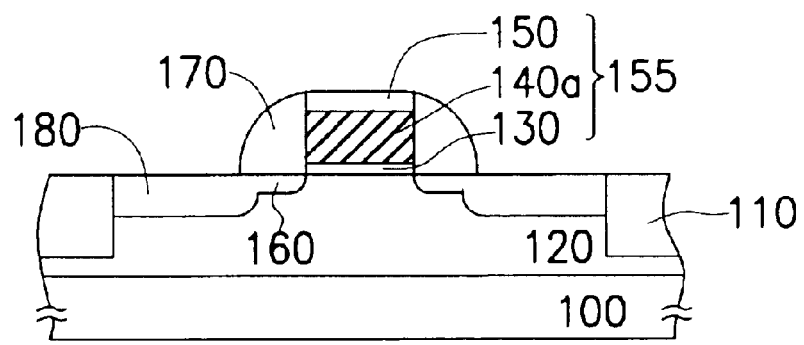

Referring to FIG. 2, the anti-reflection coating 150, the polysilicon layer 140 and the gate dielectric film 130 are patterned to form a gate structure 155, wherein the polysilicon layer 140 is patterned into a gate 140a. Then, a source/drain (S/D) extension 160 is formed in the substrate 100 using the gate structure 155 as a mask. A spacer 170 is formed on the sidewalls of the gate structure 155 by, for example, forming a conformal insulating layer (not shown) over the substrate 100 and then anisotropically etching the conformal insulating layer. The material of the spacer 170 can be SiN or SiON, for example. A source/drain (S/D) region 180 is then formed in the substrate 100 using the gate structure 155 and the spacer 170 as a mask. The S/D extension 160 and the S/D region 170 have N-type (or P-type) conductivity as an NMOS (or PMOS) is to be fabricated. The S/D extension 160 and the S/D region 170 both can be formed with, for example, ion implantation.

Accordingly, this invention can be readily used in a CMOS manufacturing process, while FIGS. 1–6 illustrate a representative half of the manufacturing process, i.e., a NMOS process or a PMOS process.

Figure 3:
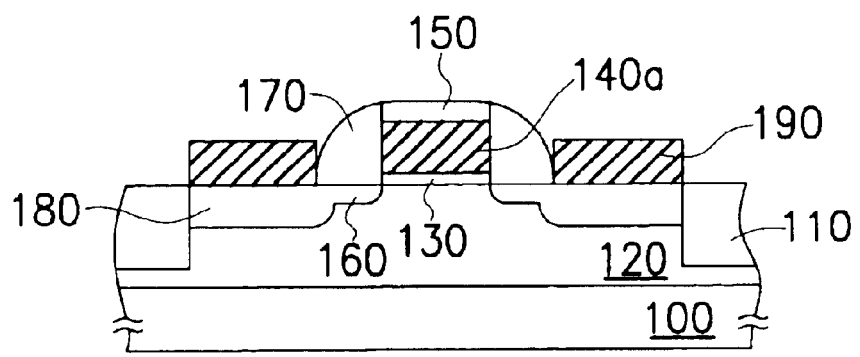

Referring to FIG. 3, a raised source/drain 190 is formed on the source/drain region 180 with a selective epitaxial growth (SEG) process, wherein the epitaxial silicon is selectively grown on the source/drain region 180. Such epitaxial silicon is not formed over the polysilicon gate 140a because of the protection of the anti-reflection coating 150.

Figure 4:
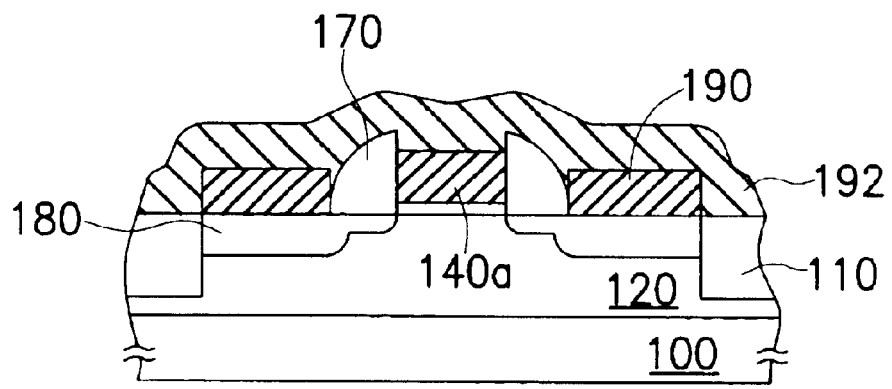

Referring to FIG. 4, the anti-reflection coating 150 is removed with wet etching or dry etching. If the material of the anti-reflection coating 150 is SiN or SiON, phosphoric acid or dry etching can be used to remove it. A metal layer 192 is then formed over the substrate 100 contacting with the polysilicon gate 140a and the source/drain region 180. The metal layer 192 comprises a refractory metal, such as nickel (Ni) or cobalt (Co), wherein nickel is more preferable. The method for forming the metal layer 192 may be a physical method, such as evaporation or sputtering.

Figure 5:
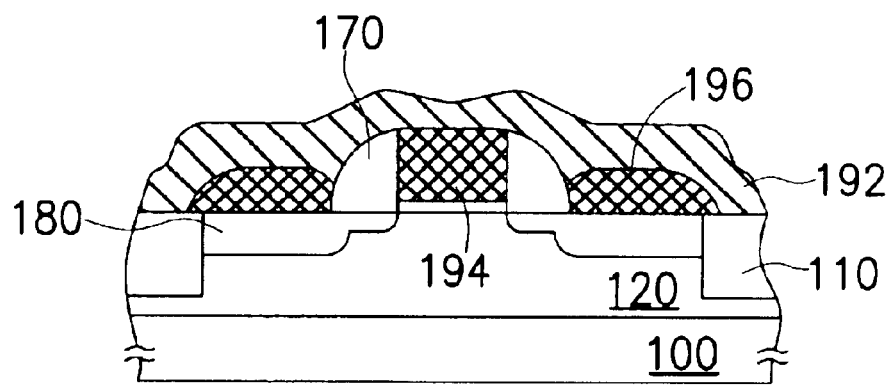

Referring to FIG. 5, a first annealing step is performed to induce a rection between the polysilicon gate 140a, the raised source/drain 190 and the metal layer 192. The first annealing step is continued until the polysilicon gate 140a is fully silicided to be a silicide gate 194, wherein the raised source/drain 190 is also converted into a silicide contact 196.

Figure 6:
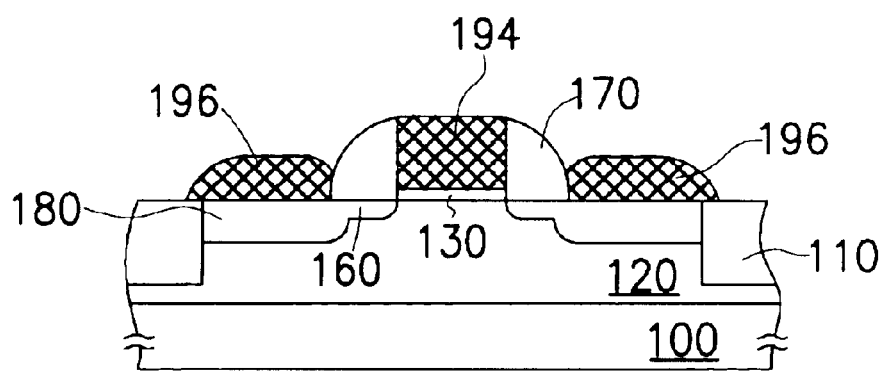

Referring to FIG. 6, the remaining metal layer 192 that does not react with silicon is removed by using a wet etching method, which may utilizes an $HCl/NH_4OH/H_2O$ solution. A second annealing step is then performed to convert the phase of the silicide gate 194 and the silicide contact 196 into a low-resistance phase.

As mention above, since the raised source/drain 190 formed on the S/D region 180 provides an additional silicon source in the full silicidation in this invention, fewer silicon atoms in the source/drain region 180 are consumed. Therefore, it is possible to fully silicide the polysilicon gate 140a without damaging the shallow S/D junction. Consequently, the resistance of the gate can be significantly lowered, and the S/D junction leakage in the vertical direction and the junction-channel leakage in the lateral direction both can be greatly reduced.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a transistor having a fully silicided gate, comprising:
   providing a substrate with a semi-finished transistor formed thereon, wherein the semi-finished transistor comprises a gate dielectric film, a silicon gate on the gate dielectric film, a cap layer on the silicon gate, a spacer on sidewalls of the silicon gate and a source/drain region in the substrate beside the silicon gate;
   forming a raised source/drain on the source/drain region;
   removing the cap layer; and
   performing a full silicidation process to fully silicide the silicon gate.

2. The method of claim 1, wherein the raised source/drain is formed with a selective epitaxial growth (SEG) process, and a silicide contact is also formed from the raised source/drain in the full silicidation process.

3. The method of claim 1, wherein the full silicidation process comprises:
   forming a metal layer over the substrate;
   performing a first annealing step to induce a reaction between the silicon gate and the metal layer, such that the silicon gate is fully silicided; and
   removing the remaining metal layer.

4. The method of claim 3, wherein the metal layer comprises a nickel layer.

5. The method of claim 3, wherein the metal layer comprises a cobalt layer.

6. The method of claim 3, wherein the full silicidation step further comprises performing a second annealing step after the remaining metal layer is removed.

7. The method of claim 1, wherein the gate dielectric film comprises a silicon oxide film or a silicon oxide/silicon nitride (ON) composite film.

8. The method of claim 1, wherein the silicon gate comprises a polysilicon gate.

9. The method of claim 1, wherein the cap layer comprises an anti-reflection layer.

10. The method of claim 9, wherein the anti-reflection layer comprises silicon nitride or silicon oxynitride.

11. The method of claim 1, wherein the source/drain region includes a source/drain extension under the spacer.

12. A method for fabricating a transistor having a fully silicided gate, comprising:
   sequentially forming a gate dielectric film, a silicon layer and an anti-reflection layer on a silicon substrate;
   patterning the anti-reflection layer, the silicon layer and the gate dielectric film to form a gate structure, wherein the silicon layer is patterned into a silicon gate;
   forming a source/drain extension in the substrate beside the gate structure;
   forming a spacer on sidewalls of the gate structure;
   forming a source/drain region in the substrate beside the spacer;
   performing a selective epitaxial growth (SEG) process to form a raised source/drain on the source/drain region;
   removing the anti-reflection layer; and
   performing a full silicidation process to fully silicide the silicon gate and simultaneously to form a silicide contact from the raised source/drain.

13. The method of claim 12, wherein the full silicidation process comprises:
   forming a metal layer over the substrate covering the silicon gate and the raised source/drain;
   performing a first annealing step to induce a reaction between the silicon gate, the raised source/drain react and the metal layer, such that the silicon gate is fully silicided; and
   removing the remaining metal layer.

14. The method of claim 13, wherein the metal layer comprises a nickel layer.

15. The method of claim 13, wherein the metal layer comprises a cobalt layer.

16. The method of claim 13, wherein the full silicidation process further comprises performing a second annealing step after the remaining metal layer is removed.

17. The method of claim 12, wherein the gate dielectric film comprises a silicon oxide film or a silicon oxide/silicon nitride (ON) composite film.

18. The method of claim 12, wherein the silicon layer comprises a polysilicon layer.

19. The method of claim 12, wherein the anti-reflection layer comprises silicon nitride.

20. The method of claim 12, wherein the anti-reflection layer comprises silicon oxynitride.

* * * * *